March 26, 1968 J. E. McTAGGART 3,375,462
FREQUENCY CONTROL TRANSISTOR CONNECTED ACROSS
CAPACITOR OF OSCILLATOR
Filed Oct. 10, 1966

INVENTOR.
JAMES E. McTAGGART
BY
PATENT AGENT 3,375,462

FREQUENCY CONTROL TRANSISTOR CONNECTED ACROSS CAPACITOR OF OSCILLATOR

James E. McTaggart, Waterloo, Ontario, Canada, assignor to Dominion Electrohome Industries Limited, Kitchener, Ontario, Canada Filed Oct. 10, 1966, Ser. No. 585,558
8 Claims. (Cl. 331—8)

ABSTRACT OF THE DISCLOSURE

The frequency of an oscillator having a tank circuit comprising a coil, a first capacitor and a frequency determining capacitor, the latter two components being connected in a series circuit shunting the coil, is controlled by a control signal supplied to the base electrode of a transistor in a reactance network connected to the tank circuit. The transistor is connected in common collector configuration and operates under class C conditions. The transistor shunts the frequency determining capacitor.

This invention relates to reactance networks for controlling the frequency of oscillation of an oscillator of a type having a tank circuit that includes an inductance coil, a frequency determining capacitor, and another capacitor. More particularly, this invention relates to reactance networks of a type particularly suited for use in the horizontal circuitry of television receivers, and, also, to television receivers employing such reactance networks.

The tank circuit of the horizontal oscillator of a television receiver may consist of two capacitors and an inductance coil, one terminal of each of the two capacitors being connected together, and the other terminals of the capacitors each being connected to a different one of the two terminals of the coil. It is known that the resonant frequency of such a tank circuit may be varied by connecting a transistor in shunt with one of the capacitors, which then becomes the frequency determining capacitor, the transistor being connected in common emitter configuration, and varying the conductivity of the transistor by means of a signal applied to its base electrode. The same effect may be achieved if only one of the capacitors is connected directly across the coil, the other capacitor being connected between the collector electrode of the transistor and one of the common terminals of the coil and the capacitor that is connected directly across the coil. In such a network the transistor still is connected in common emitter configuration, but the circuit consisting of the transistor and the capacitor in its collector circuit is in parallel with both the coil and the capacitor, that is connected directly across the coil. In such a circuit, the capacitor directly connected to the collector electrode of the transistor is the frequency determining capacitor.

Both of the circuits to which reference has just been made require the provision of a positive supply voltage or a negative supply voltage dependent upon whether the transistor is an NPN type or a PNP type respectively.

In accordance with this invention there is provided a reactance network for an oscillator having a tank circuit including a coil, and two capacitors connected in a series circuit that shunts the coil that comprises a transistor connected in common collector configuration and for which no separate power supply is required, since the necessary collector voltage for the transistor is derived from the oscillator circuit. The frequency determining capacitor of the tank circuit is connected in a circuit between the emitter and collector electrodes of the transistor.

This invention will become more apparent from the following detailed description, taken in conjunction with the appended drawings, in which.

Figure 1:
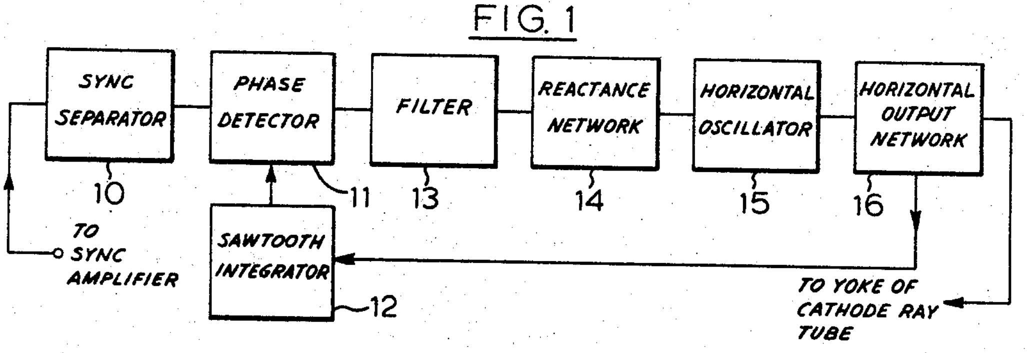
FIG. 1 is a block diagram of an A.F.C. system embodying this invention.

With reference first to FIGURE 1, sync pulses from a sync separator 10 are supplied to a phase detector 11, which may be of the type described and claimed in copending Canadian patent application Ser. No. 943,651, filed Oct. 25, 1965, for Phase Detector (United States patent application Ser. No. 503,149, filed Oct. 23, 1965). Phase detector 11 also is supplied with a sawtooth signal from a sawtooth integrator 12, and the output signal from phase detector 11 is a D.C. control signal whose magnitude indicates the difference in phase between the two input signals to the phase detector. This control signal is filtered by a filter 13, and then it is supplied to a reactance network 14 embodying this invention. The reactance network includes a transistor whose conductivity is varied by the input signal to the network, i.e., the control signal, the effect of which is to vary the frequency of oscillation of a horizontal oscillator 15 in a direction such that the two input signals to the phase detector will become locked in phase. The output signal from oscillator 15 is supplied to a horizontal output network 16, which includes a flyback transformer (not shown), and signals from this latter network are derived and supplied to sawtooth integrator 12 and the horizontal windings (not shown) of the deflection yoke (not shown) of a cathode ray tube (not shown).

Figure 2:
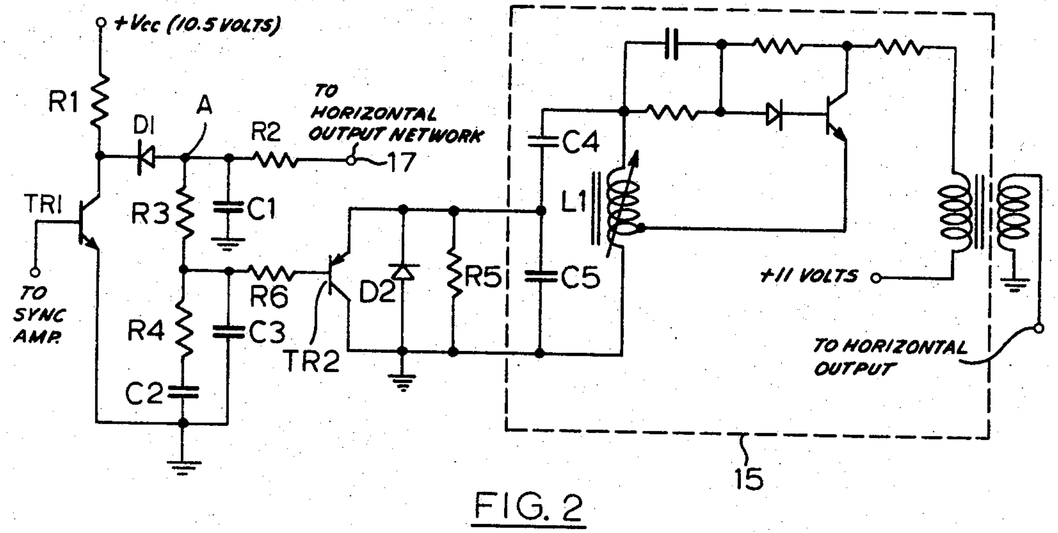
FIG. 2 is a circuit diagram of a part of the system illustrated in FIG. 1.

With reference now to FIGURE 2, a transistor TR1 constitutes the active element of phase detector 11 (FIG. 1) and sync separator 10 (FIG. 1). The emitter electrode of transistor TR1 is grounded, while its collector electrode is connected via a resistor R1 to a positive D.C. supply voltage (+Vcc), which may be +10.5 volts, for example. Phase detector 11 also includes a diode D1, the cathode of which is connected to the collector electrode of transistor TR1.

Sawtooth integrator 12 (FIG. 1) is constituted by a resistor R2 and a capacitor C1. One terminal of resistor R2 is connected to the anode of diode D1, and capacitor C1 is connected between this terminal of resistor R2 and ground. The other terminal 17 of resistor R2 is connected to horizontal output network 16 (FIG. 1).

Filter 13 (FIG. 1) is constituted by resistors R3 and R4 and capacitors C2 and C3. Resistors R3 and R4 and capacitor C2 form a series circuit between the anode of diode D1 and ground with one terminal of resistor R3 being connected to the anode of diode D1, the other terminal of resistor R3 and one terminal of resistor R4 being common, and one terminal of capacitor C2 being grounded. Capacitor C3 is connected across the series circuit constituted by resistor R4 and capacitor C2.

Reactance network 14 (FIG. 1) includes a transistor TR2 connected in common collector configuration, a diode D2 connected between the grounded collector electrode of transistor TR2 and its emitter electrode, a resistor R5 connected across diode D2 and a resistor R6. Diode D2, it will be noted has its anode connected to the collector electrode of transistor TR2 and its cathode connected to the emitter electrode of the transistor. Diode D2 and resistor R5 shunt each other and capacitor C5. Resistor R6 is connected between the base electrode of transistor TR2 and the common terminal of resistors R3 and R4.

The tank circuit of oscillator 15, one type of which is shown in FIG. 2, is constituted by two capacitors C4 and C5 and a coil L1. One terminal of each capacitor is common, while the other terminals of capacitors C4 and C5 are connected to coil L1. Transistor TR2 is connected across capacitor C5, as are resistor R5 and diode D2, of course. Capacitor C5 is the frequency determining element of the tank circuit in the system shown in FIGURE 2.

The operation of the circuit of FIGURE 2 now will be discussed. In the manner described in the aforementioned application, there is developed at point A a D.C. voltage whose magnitude is indicative of the difference in phase between the amplified horizontal sync pulses appearing at the collector electrode of transistor TR1 and the sawtooth signal developed by the sawtooth integrator consisting of resistor R2 and capacitor C1. The D.C. control voltage at point A is such that if the frequency of oscillation of oscillator 15 tends to drift lower, the D.C. control voltage will become more positive. Conversely, if the frequency of oscillation tends to increase, the D.C. control voltage will become less positive.

Transistor TR2 operates under class C conditions. During oscillation, a sine wave signal is developed across capacitor C5 and is applied between the collector and emitter electrodes of transistor TR2. During positive-going half cycles of this signal, when the emitter voltage of transistor TR2 exceeds the base-emitter drop of the transistor plus the control voltage applied to its base electrode, transistor TR2 will conduct and will remain conducting until its emitter voltage drops below the critical level. The portion of each positive-going half cycle during which transistor TR2 conducts obviously will become smaller the more positive is the control voltage applied to the base electrode of transistor TR2. Conversely, the less positive the control voltage, the longer will be the conduction time of transistor TR2.

Let it be assumed that the frequency of oscillation of oscillator 15 tends to drift lower. The D.C. control voltage at point A will become more positive. This D.C. signal is filtered by the filter consisting of resistors R3 and R4 and capacitors C2 and C3 and is applied to the base electrode of transistor TR2 via resistor R6. Naturally the voltage at the base electrode of transistor TR2 will become more positive. Therefore transistor TR2 will remain in conduction for a shorter period of time. Hence the interval during which transistor TR2 essentially short circuits capacitor C5 will decrease, and the frequency of oscillation of oscillator 15 therefore will increase to compensate for its original tendency to drift lower in frequency. Conversely, any tendency for the frequency of oscillation to increase will result in a less positive control voltage at the base electrode of transistor TR2, longer conduction of this transistor during positive-going half cycles of the signal developed across capacitor C5 and a consequent decrease in the frequency of oscillation.

Diode D2 conducts during negative-going half cycles of the sine wave signal developed across capacitor C5 to minimize D.C. charging of this capacitor and to force conduction of transistor TR2 to occur over portions of the positive-going half cycles most favourable from the point of view of optimizing circuit performance.

Resistor R5 further optimizes circuit performance by minimizing the effects of supply voltage variations on the A.F.C. system described.

Resistor R6 serves a current limiting function and also tends to linearize picture shift (phase shift between sync signal and locked-in oscillator) as a function of free-running oscillator frequency.

It should be noted that the A.F.C. loop shown in FIGURES 1 and 2 meets both basic requirements of an A.F.C. loop, namely, (a) loop gain adequate at both ends of the dynamic operating range to give the required off-frequency pull-in range using a suitable filter network, and (b) D.C. control voltage changes in such a way in response to an initial frequency change that the reactance circuit opposes the initial frequency change.

In connection with requirement (a), the output impedance of the phase detector shown in FIGURE 2 is different at one end of its dynamic operating range than at its other. Similarly, the input impedance of the transistor reactance circuit varies greatly over its dynamic range. In order to maximize and balance the pull-in range, the circuit of FIGURE 2 has been designed to provide a complementary impedance match in that at one end of the dynamic range where maximum diode (D1) current flows in the phase detector, the input current supplied to the reactance circuit also is a maximum.

By way of example only, the following components may be used in the circuit of FIG. 2:

| | |
|---|---|
| TR1—2N3691 | R6—10KΩ |
| TR2—2N3640 | C1—0.0047 μfd. |
| R1—1500Ω | C2—5.0 μfd. |
| R2—39KΩ | C3—0.01 μfd. |
| R3—4700Ω | C4—0.01 μfd. |
| R4—3300Ω | C5—0.01 μfd. |
| R5—680Ω | |

While preferred embodiments of this invention have been disclosed herein, those skilled in the art will appreciate that changes and modifications may be made therein without departing from the spirit and scope of this invention as defined in the appended claims.

What I claim is:

1. In combination, an oscillator having a tank circuit including an inductance coil, a first capacitor and a frequency determining capacitor, said capacitors being connected in a series circuit with each other, said series circuit being connected in shunt with said coil; a reactance network including a transistor connected in common collector configuration, operating under class C conditions, and having base, collector and emitter electrodes, said frequency determining capacitor being connected in a circuit between said emitter and collector electrodes, whereby said transistor shunts said frequency determining capacitor; and means for supplying a control signal to said base electrode to vary the impedance of said transistor and hence the impedance shunting said frequency determining capacitor.

2. The invention according to claim 1 including a diode connected in shunt with said frequency determining capacitor.

3. The invention according to claim 1 including a resistor connected in shunt with said frequency determining capacitor.

4. The invention according to claim 3 including a diode connected in shunt with said resistor.

5. The invention according to claim 1 including a phase detector adapted to provide at an output terminal an output signal varying in accordance with the difference in phase between two input signals supplied to said phase detector, said means for supplying said control signal to said base electrode being connected between said output terminal and said base electrode.

6. The invention according to claim 5 wherein said means for supplying said control signal to said base electrode includes a filter.

7. The invention according to claim 6 including a sawtooth integrating network for supplying one of said input signals for said phase detector, and means connected between said oscillator and said sawtooth integrating network for supplying a signal indicative of the frequency of oscillation of said oscillator to said sawtooth integrating network.

8. The invention according to claim 7 including a sync separator network for supplying the other of said input signals.

References Cited

UNITED STATES PATENTS

| | | | |
|---|---|---|---|
| 2,844,795 | 7/1958 | Herring | 332—16 |
| 3,319,179 | 5/1967 | Hepner | 331—8 |

OTHER REFERENCES

M. S. Kiver, Radio and Television News, pp. 44–46, February 1950, 178–5.8 AFC.

JOHN KOMINSKI, *Primary Examiner.*